(12) United States Patent
Lichter et al.

(10) Patent No.: US 6,970,045 B1
(45) Date of Patent: Nov. 29, 2005

(54) REDUNDANT CLOCK MODULE

(75) Inventors: Jerry A. Lichter, Burlington, WI (US); David T. Jones, Waterford, WI (US)

(73) Assignee: Nel Frequency Controls, Inc., Burlington, WI (US)

( * ) Notice: Subject to any disclaimer, the term of this patent is extended or adjusted under 35 U.S.C. 154(b) by 44 days.

(21) Appl. No.: 10/783,923

(22) Filed: Feb. 19, 2004

Related U.S. Application Data

(60) Provisional application No. 60/482,557, filed on Jun. 25, 2003.

(51) Int. Cl.[7] .............................................. H03L 7/00
(52) U.S. Cl. ........................... 331/2; 331/46; 331/49; 713/500
(58) Field of Search ......................... 331/18, 25, 1 A, 331/46, 2, 49; 713/500

(56) References Cited

U.S. PATENT DOCUMENTS

| | | |
|---|---|---|
| 4,038,608 A | 7/1977 | Bard |
| 4,240,047 A | 12/1980 | Rabinowitz et al. |
| 4,254,492 A | 3/1981 | McDermott, III |
| 4,282,493 A | 8/1981 | Moreau |
| 4,369,515 A | 1/1983 | Valdes |
| 4,412,342 A | 10/1983 | Khan et al. |
| 4,521,745 A | 6/1985 | Falconer |
| 4,574,377 A | 3/1986 | Miyazaki et al. |
| 4,653,054 A | 3/1987 | Liu et al. |
| 4,683,570 A | 7/1987 | Bedard et al. |
| 4,691,126 A | 9/1987 | Splett et al. |
| 4,723,227 A | 2/1988 | Murotani |
| 4,745,376 A | 5/1988 | Aleksa et al. |
| 4,779,008 A | 10/1988 | Kessels |
| 4,839,855 A | 6/1989 | Van Driel |
| 4,868,514 A | 9/1989 | Azevedo et al. |
| 4,922,128 A | 5/1990 | Dhong et al. |
| 4,979,191 A | 12/1990 | Bond et al. |
| 5,036,216 A | 7/1991 | Hohmann et al. |
| 5,052,030 A | 9/1991 | Ernst et al. |
| 5,095,280 A | 3/1992 | Wunner et al. |
| 5,124,569 A | 6/1992 | Phillips |
| 5,146,585 A | 9/1992 | Smith, III |
| 5,260,979 A * | 11/1993 | Parker et al. ............... 375/366 |
| 5,355,090 A | 10/1994 | Pajowski et al. |
| 5,416,443 A | 5/1995 | Cranford, Jr. et al. |
| 5,570,397 A | 10/1996 | Kubista |
| 5,631,931 A | 5/1997 | Takano et al. |
| 5,664,165 A | 9/1997 | Curry et al. |
| 5,726,607 A | 3/1998 | Brede et al. |
| 5,745,742 A | 4/1998 | Selway et al. |
| 5,812,822 A | 9/1998 | Selway et al. |
| 5,859,996 A | 1/1999 | Dryer et al. |
| 5,883,533 A | 3/1999 | Matsuda et al. |

(Continued)

*Primary Examiner*—Arnold Kinkeadd
(74) *Attorney, Agent, or Firm*—Godfrey & Kahn, S.C.

(57) ABSTRACT

A redundant clock module provides a highly reliable fixed clock reference output. This clock reference output is based on at least two internal reference oscillators that are monitored and eliminated from use if they are not operating or within tolerance requirements. The redundant clock module comprises at least two oscillators, detection circuitry, switching circuitry and control circuitry. If a primary oscillator fails or is out of tolerance, the redundant clock module will detect the failure or out of tolerance condition and switch to a secondary working and in tolerance oscillator to take over primary timing functions of an end user application. The redundant clock module provides a slow and seamless transition between oscillator switching to assure no significant phase shift or runt pulses will affect the end user application.

11 Claims, 7 Drawing Sheets

U.S. PATENT DOCUMENTS

| | | |
|---|---|---|
| 5,886,557 A | 3/1999 | Wilcox |
| 5,911,064 A | 6/1999 | Samsom et al. |
| 5,991,844 A | 11/1999 | Khosrowpour |
| 6,011,808 A | 1/2000 | Larsson et al. |
| 6,055,362 A | 4/2000 | Kesner et al. |
| 6,107,855 A | 8/2000 | Wilcox |
| 6,188,286 B1 | 2/2001 | Hogl et al. |
| 6,194,969 B1 | 2/2001 | Doblar |
| 6,204,732 B1 | 3/2001 | Rapoport et al. |
| 6,349,391 B1 | 2/2002 | Petivan et al. |
| 6,359,945 B1 | 3/2002 | Doblar |
| 6,516,422 B1 | 2/2003 | Doblar et al. |

* cited by examiner

REDUNDANT CLOCK MODULE

CROSS-REFERENCE TO RELATED APPLICATIONS

This application claims the benefits of U.S. Provisional Application No. 60/482,557, filed Jun. 25, 2003, the disclosure of which is incorporated herein by reference.

BACKGROUND OF THE INVENTION

The present invention relates generally to electronic oscillators, and more particularly to a redundant clock module for use in electronic circuits requiring a stable fail-safe oscillator. The present invention provides a primary clock source with at least one other alternate clock source that takes over for the primary clock source in the event of a failure or out of tolerance condition with the primary clock source. If the primary clock source fails or is out of tolerance, the circuitry of the present invention will detect the failure or out of tolerance condition and seamlessly switch to an alternate clock source.

Crystal controlled oscillators are key system components that synchronize and distribute data signals for a wide variety of electronic equipment. The oscillators provide clock signals used for timing and synchronizing of electronic circuits. These oscillators have common failure modes that are not presently adequately addressed in the prior art. Crystal controlled oscillators commonly fail to start at the correct frequency, but will generate a signal that is often within the operational range of the circuitry that it is driving. These incorrect frequencies can be approximately 1% from the desired frequency in the case of an oscillator that is free running near the crystal frequency, 0.1% in the case of an oscillator operating in a spurious mode of the crystal frequency, or 0.01% in the case of an oscillator that has aged out of tolerance. In these instances, the electronic circuitry may continue to operate, but at an unwanted frequency.

Failures of a crystal controlled oscillator are not limited to a clock source that is stuck high or low, but an oscillator that is out of frequency tolerance due to the oscillator operating on the wrong crystal overtone order or mode, an oscillator operating in a spurious mode of the crystal, or an oscillator not operating on the crystal at all. In mission critical applications, it is imperative that the crystal controlled oscillator be working and be within tolerance at all times. Therefore, it would be highly desirable to have electronic circuitry which would monitor the oscillator and seamlessly switch to another oscillator if the primary oscillator fails or is out of tolerance.

Electronic circuitry for monitoring the health of an oscillator and switching to an alternate oscillator if a failure in the primary oscillator is detected is known in the prior art. Motorola, Cypress and Integrated Circuit Systems have each developed phase lock loop (PLL)-based clock generator integrated circuits (ICs) that generate clock signals from redundant clock sources after detecting a failure of the original clock source. The Motorola MPC9893/MPC9894/MPC9993 series of PLL-based clock generators all contain logic for clock redundant applications, such as clock failure detection and auto switching capabilities. These ICs utilize a fully integrated PLL to generate system clock signals for up to four redundant clock sources and continuously monitor two input clock signals. On detection of a clock failure, the circuit is designed to switch to a secondary clock for phase/frequency alignment. The Cypress CY23020 PLL-based zero delay buffer IC is designed for high-speed clock distribution applications. If a failure is detected in a clock source, the circuit switches to a redundant clock source. The Integrated Circuit Systems ICS879931 PLL clock driver with clock switch IC is designed specifically for redundant clock applications. The circuit continuously monitors the two input clock signals. Upon detection of a failure (clock stuck high or low for at least one period), the circuit switches the PLL reference clock to the other clock input signal and phase/frequency alignment will occur with minimal output phase disturbance. Disadvantages of the above ICs is that they don't detect free running clocks (oscillators that are not crystal controlled, but still within the operating frequency range of the IC) and they don't detect out of tolerance conditions. Another disadvantage of the above ICs is that they have higher jitter and phase noise than most high stability applications can tolerate, compared to the hybrid solution of the present invention.

Accordingly, a need exists for an improved redundant clock module that monitors a clock source for failures and out of tolerance conditions and seamlessly switches to an alternate clock source upon detection of a failure or out of tolerance condition of the primary without any system shutdown, glitch, or crash.

SUMMARY OF THE INVENTION

The redundant clock module of the present invention preferably comprises at least two crystal oscillators, detection circuitry, switching circuitry and control circuitry. The redundant clock module of the present invention targets mission critical applications where clock redundancy is required. The redundant clock module supplies a highly reliable fixed clock reference output based on one of the at least two internal reference oscillators that are monitored to make sure that they are operating properly and within tolerance. If the primary oscillator fails or is out of tolerance, the redundant clock module will detect the failure or out of tolerance condition and switch to a secondary working oscillator to take over primary timing functions. The redundant clock module provides a slow seamless transition between switching to assure no significant phase shift or runt pulses will affect the end user application.

As mentioned above, the redundant clock module includes at least two reference oscillators that provide an output to an end user application. The oscillators also provide outputs to the detection circuitry for monitoring operation of the oscillators and detecting a failure or out of tolerance condition. In the event that an oscillator fails or is out of tolerance, the redundant clock module will disconnect power to the failed oscillator and switch to a working oscillator to provide the output to the end user application.

The detection circuitry preferably includes a detection control loop for monitoring inputs from the oscillators. A separate detection circuit is provided for each reference oscillator. The oscillators are monitored by comparing the oscillator output frequency to a voltage controlled oscillator (VCO) frequency on the detection circuitry. A VCO is an oscillator whose output frequency depends on the input control voltage. By knowing the voltage versus frequency characteristic of the VCO, the control voltage of the VCO can be monitored using analog voltage comparators to determine if the reference oscillators are working and within the frequency tolerance requirement. The detection circuit further includes analog voltage comparators to compare the control voltage of the VCO to a fixed reference voltage generated in the detection circuit that is the voltage equivalent of the frequency limit established by the tolerance desired and the VCO characteristic. The detection circuitry thus provides analog monitoring of control voltage rather than frequency or time sampling.

The detection circuitry compares the control voltage of each monitoring circuit VCO for the associated reference oscillator and determine if the oscillator is operational and within frequency tolerance. The detection circuitry generates an error signal that indicates that an oscillator has failed. Each oscillator being monitored has its own independent error signal. If a failure or out of tolerance condition is detected by the detection circuitry, the switching circuitry will remove power from the failed oscillator and switch to a working oscillator. The detection circuitry monitors all oscillator outputs to make sure that an oscillator is operating and within tolerance before the switching circuitry switches to it.

The switching circuitry receives inputs from the detection circuitry for initializing a error signal for a failed or out of tolerance oscillator, removing power from the failed or out of tolerance oscillator and selecting and switching to a working and in tolerance oscillator. The switching circuitry holds off the error signal until power is established. After power is established, the switching circuitry will output an enable signal to enable the output of the redundant clock module. The switching circuitry also controls which oscillator is selected by sending out control signals to control circuitry for the oscillators, which are based on the error signals and reset signals. Digital control circuitry is used to switch to a new working and in tolerance oscillator.

A separate switching control loop is used to monitor the oscillator frequency and determine when to switch to another oscillator. The switching control loop is independent of the detection control loop. This is done so that the detection control loop has a fast response time to detect a failure, but the switching control loop has a slow response time to switch from a failed or out of tolerance oscillator to a working and in tolerance oscillator. The switching control loop response time is slower than the detection control loop response time to allow the output frequency of the switching VCO to change slowly in the event that an oscillator fails. The output frequency of the switching VCO will slowly lock to a new oscillator once it is selected. A new working and within tolerance oscillator output is seamlessly provided at the output of the redundant clock module for continuing to provide an uninterrupted clock signal to the end user application.

Advantages of the present invention include the ability to detect an oscillator output that is stuck high or low, an oscillator that is free running at a different frequency from the crystal frequency, an oscillator that is no longer stable or no longer crystal controlled, an oscillator running on a wrong overtone order, or an oscillator running on a spurious mode of the crystal. Other advantages of the present invention include the ability to provide a redundant clock module in a hybrid design rather than an IC design, the ability to provide a seamless transition between switching from a failed or out of tolerance oscillator to a working and in tolerance oscillator, the ability to provide analog monitoring of the oscillators, the ability to provide low jitter and phase noise, and the ability for the module to detect out of tolerance oscillators. The hybrid design provides added versatility and customization. If the frequency of an oscillator is out of tolerance, the module of the present invention will detect it, and switch to an alternate operational and in tolerance oscillator.

Various other features, objects, and advantages of the invention will be made apparent to those skilled in the art from the following detailed description, claims, and accompanying drawings.

DETAILED DESCRIPTION OF THE INVENTION

The redundant clock module of the present invention is preferably comprised of at least two crystal oscillators, detection circuitry, switching circuitry and control circuitry. The redundant clock module of the present invention is designed to continuously supply a highly reliable fixed clock reference at its output. The clock reference output is based on one of at least two internal clock references that are continuously monitored and eliminated from use if they fail or are not operating within tolerance. A slow transition between oscillator references during switching is controlled to assure no significant phase shift or runt pulses will affect the end user application. The frequency range of the redundant clock module of the present invention is preferably from 20.000 MHz to 250.000 MHz, with a user specified frequency tolerance from ±100 ppm, jitter of 5 psec rms max, and ECL compatible outputs.

Figure 1:
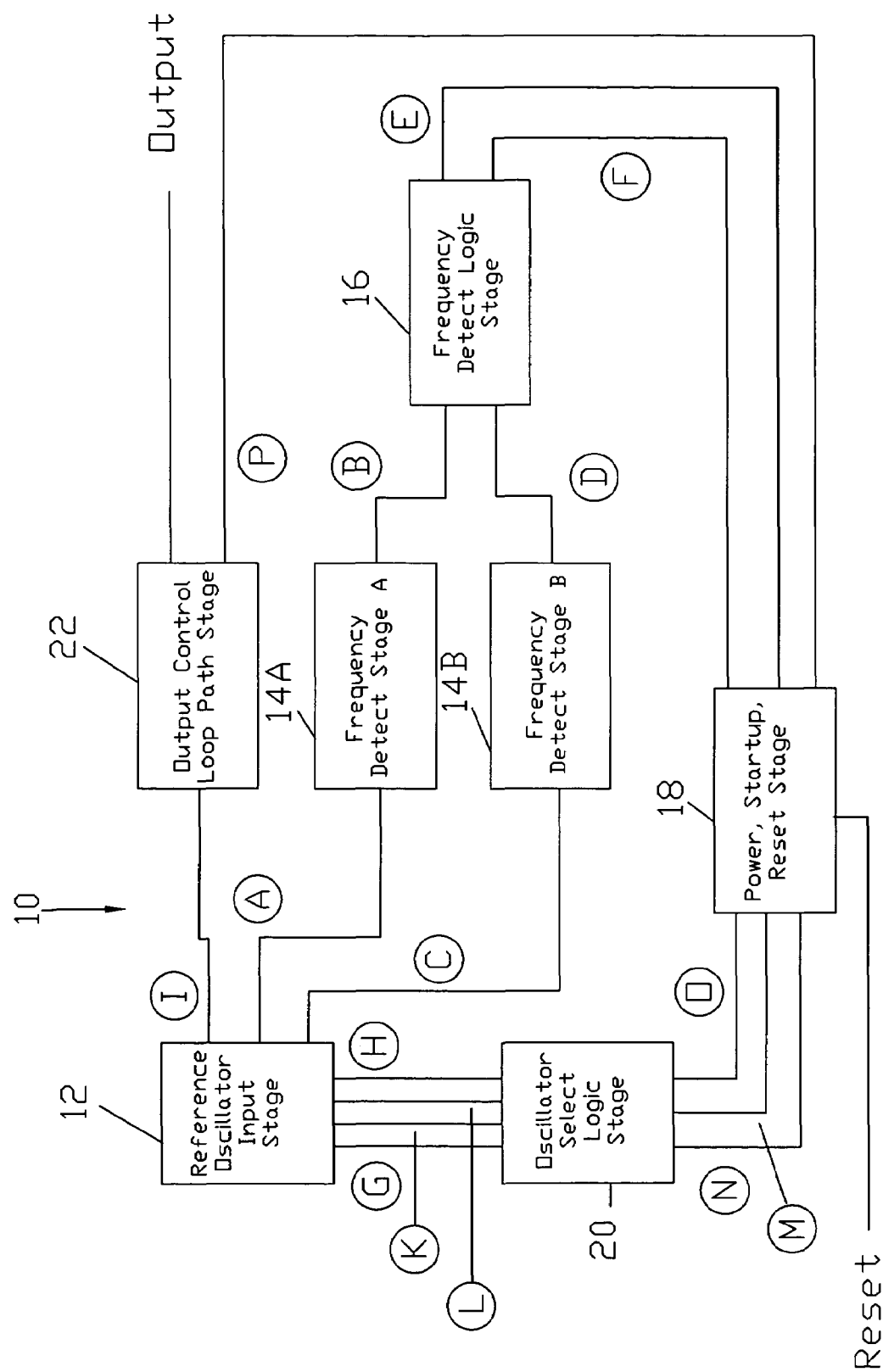
FIG. 1 is a block diagram of the redundant clock module of the present invention.

Referring now to the drawings, FIG. 1 is a block diagram of the redundant clock module 10 of the present invention. The redundant clock module 10 includes a reference oscillator input stage 12; at least two frequency detect stages 14A, 14B; a frequency detect logic stage 16; a power, startup, reset stage 18; an oscillator select logic stage 20; and an output control loop path stage 22.

The reference oscillator input stage 12 preferably includes at least two reference oscillators 24, 26 depending on the level of reliability or redundancy required. One of the reference oscillators is a primary oscillator and the other reference oscillator is a redundant secondary oscillator. The reference oscillator input stage 12 provides an output I to the output control loop path stage 22, outputs A, C, to the frequency detect stages 14A, 14B, and outputs G, H to the oscillator select logic stage 20. The reference oscillator input stage 12 receives inputs K, L from the oscillator select logic stage 20. Each oscillator 24, 26 is operating and their outputs A, C are monitored by the frequency detect stage 14A, 14B. Although only the primary oscillator needs to be operating and monitored, monitoring of the redundant secondary oscillator gives the end user confidence that there is an operational backup oscillator if the primary oscillator fails. In the event that one of the oscillators fail, the frequency detect stage 14 will disconnect power to the failed oscillator to minimize damage that could occur due to the failed oscillator. An output K of the oscillator select logic stage 20 is used to select a channel in a multiplexer to provide a good oscillator clock signal I to the output control loop path stage 22.

The frequency detect stages 14A, 14B receive inputs A, C from oscillators 24, 26 on the reference oscillator input stage 12. The frequency detect stages 14A, 14B provide outputs B, D to the frequency detect logic stage 16. The frequency detect stages 14A, 14B monitor the oscillator outputs A, C to make sure that the oscillators 24, 26 are operating. All oscillators are monitored to determine which oscillator fails or is out of tolerance, providing a means for self-testing of the redundant clock module. Each reference oscillator output A, C is monitored by the frequency detect stages 14A, 14B during operation. A separate frequency detect stage is included for each reference oscillator. The frequency detect is accomplished by comparing the oscillator output A, C frequency to a voltage controlled oscillator (VCO) frequency on the frequency detect stages 14A, 14B. A VCO is an oscillator whose output frequency depends on the input control voltage. By knowing the voltage versus frequency characteristic of the VCO, the control voltage B, D of the VCO can be monitored using analog voltage comparators on the frequency detect logic stage 16 to determine if the reference oscillators are operating and within the frequency tolerance requirement.

The frequency detect logic stage 16 receives inputs B, D from the frequency detect stages 14A, 14B to compare the control voltage B, D of each monitoring circuit for the associated reference oscillator and determine if the oscillator is operational and within frequency tolerance. The frequency detect logic stage 16 includes analog voltage comparators 54, 56 to compare the control voltages B, D to a fixed reference voltage 50 generated in the frequency detect logic stage 16 that is the voltage equivalent of the frequency limit established by the tolerance desired and the VCO characteristic. Each oscillator being monitored will have an independent error signal E, F output from the frequency detect logic stage 16 to be used to switch to an operational and within tolerance reference oscillator and shut off power to the failed oscillator.

The power, startup, reset stage 18 receives inputs E, F from the frequency detect logic stage 16 to reset the power and monitoring circuits of the frequency detect stage 14A, 14B by reset signals Reset and O in the event that a failed or out of tolerance oscillator is replaced or if circuit conditions have changed. The power, startup, reset stage 18 also holds off error signals E, F from the frequency detect logic stage 16 until the output control loop path stage 22 has had a chance to lock when first powered up. Error signals E, F become error signals M, N after power has been established. After power has been established, the power, startup, reset stage 18 will output an enable signal P to enable the Output in the output control loop path stage 22.

The oscillator select logic stage 20 controls which oscillator is to be used by the output control loop path stage 22 by sending out control signals L, K to the reference oscillator input stage 12, which are based on error signals M, N and reset signal O from the power, startup, reset stage 18.

The output control loop path stage 22 uses the same circuitry as used in the frequency detect stage 14 except the control voltage 116 for the VCO 104 in the output control loop path stage 22 is not monitored, since monitoring is done in the frequency detect stage 14A, 14B, and the control loop response in the output control loop path stage 22 is slower than in the frequency detect stage 14A, 14B. This allows the output frequency of the VCO 104 to change slowly in the event that the primary reference oscillator fails. The output frequency of the VCO 104 will slowly lock to the new reference oscillator once it is selected. The input I for the output control loop path stage 22 is selected in the reference oscillator input stage 12. Thus, there will be no glitches, large phase shifts, or runt pulses from the Output of the output control loop path stage 22 that is used to drive the user's application. The output enable signal P of the output control loop path stage 22 is controlled by the power, startup, reset stage 18.

Figure 4:
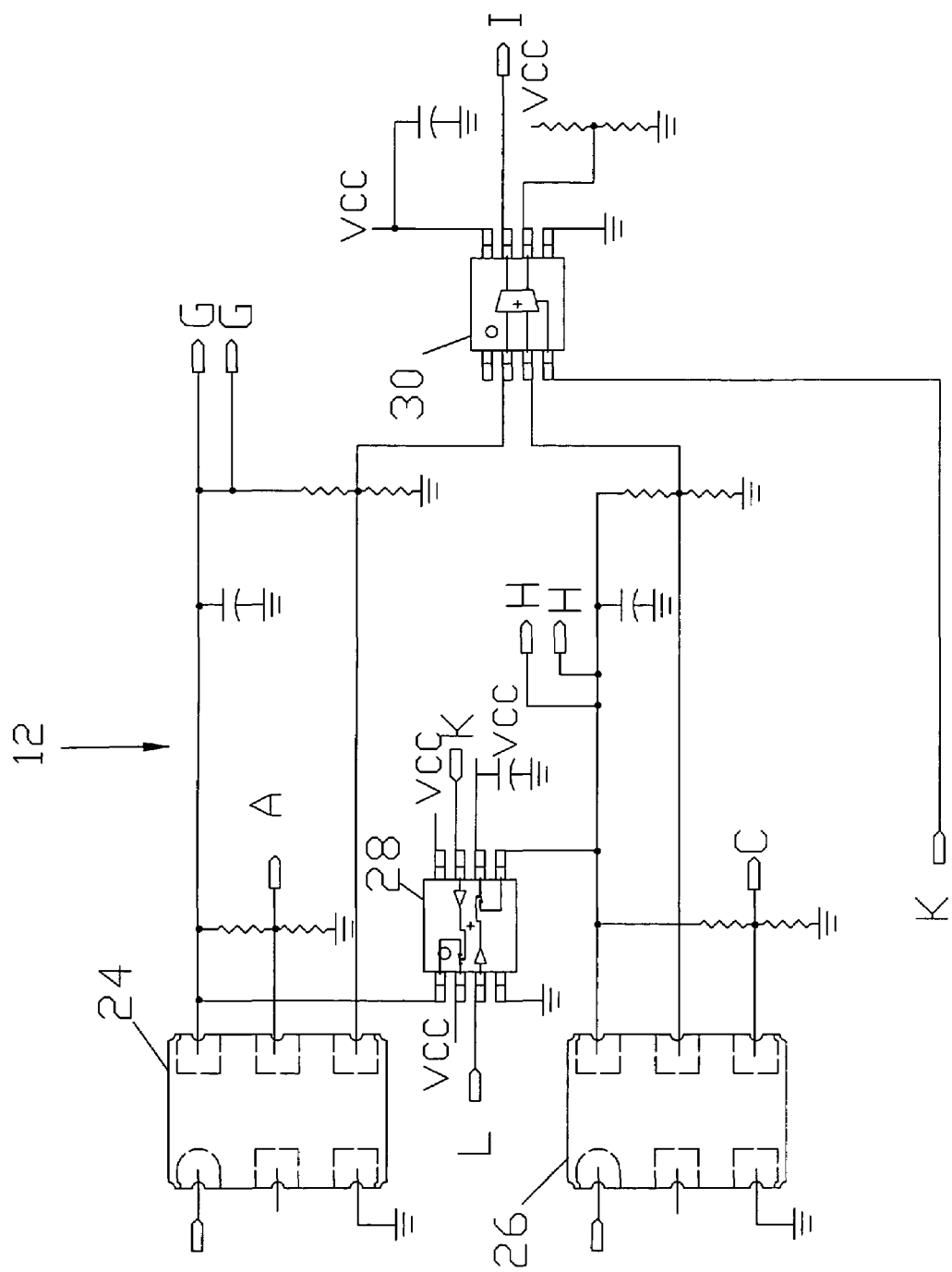
FIG. 4 is a schematic diagram of the reference oscillator input stage of the redundant clock module of the present invention.

FIG. 4 is a schematic diagram of the reference oscillator input stage 12 of the redundant clock module of the present invention. Primary reference oscillator 24 and secondary reference oscillator 26 supply the frequency sources G, H for the redundant clock module. Power to the oscillators 24, 26 is switched via analog switches 28 (MAX4742EUA) based on error signals L, K from the oscillator select logic stage 20. The oscillator output I used to drive the output control loop path stage 22 is selected by a multiplexer 30 (SY100EL58) based on the error signal K from the oscillator select logic stage 20. When the error signal K is low the multiplexer 30 selects the primary reference oscillator 24 and conversely when the error signal K is high the multiplexer 30 selects the secondary reference oscillator 26.

Figure 2:
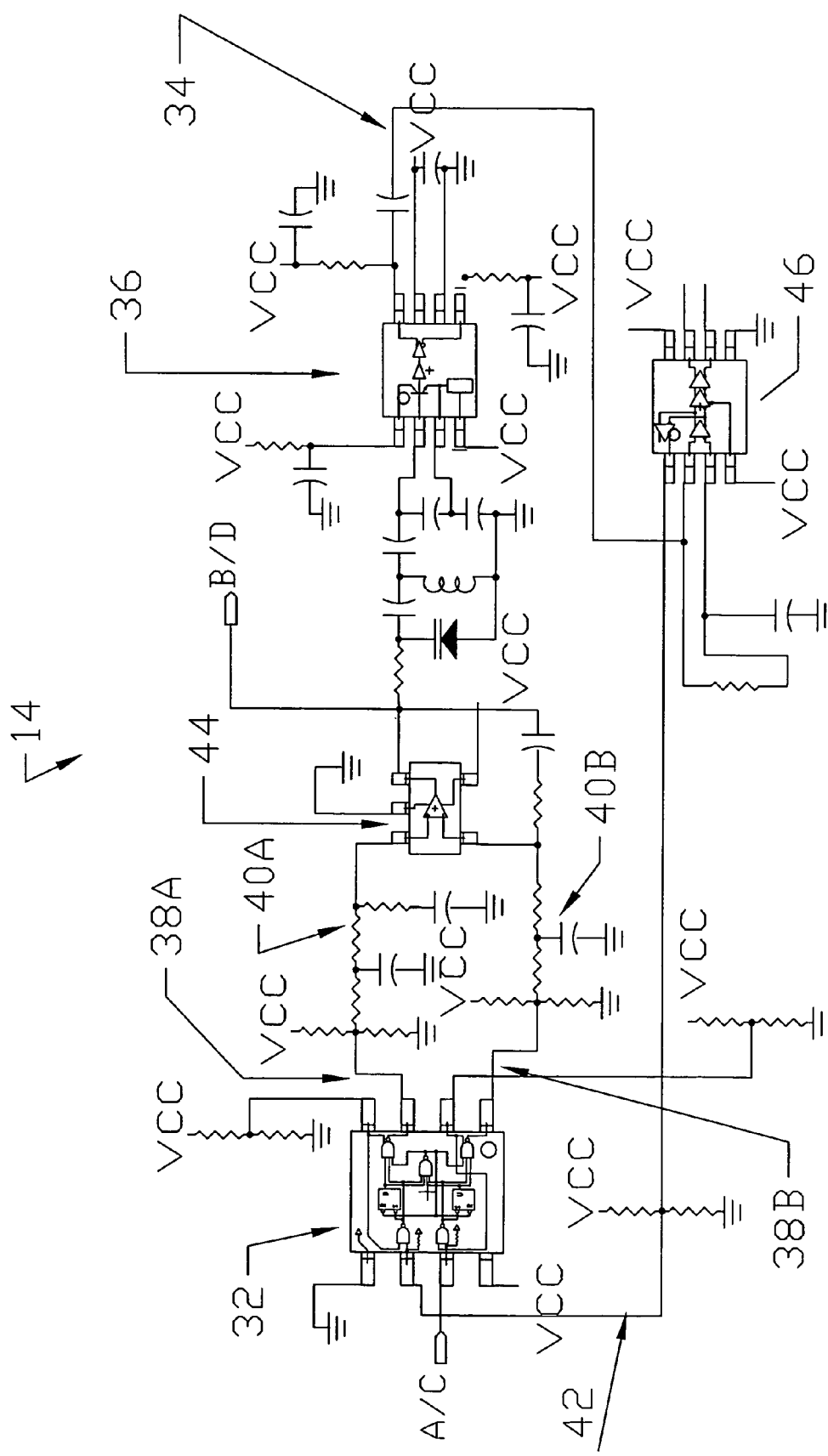
FIG. 2 is a schematic diagram of the frequency detect stage (A or B) of the redundant clock module of the present invention.

FIG. 2 is a schematic diagram of the frequency detect stage 14 of the redundant clock module of the present invention. The frequency detect stage 14 includes a phase-frequency detector 32 (SY100EP140) to compare the phase between the reference oscillator output A, C driving this stage and the output 34 of the VCO 36 (MAX2620EUA and associated discrete components) for this stage. The output 38A, 38B of the phase-frequency detector 32 is filtered by a low pass filter 40A, 40B comprising discrete components at the output 38A, 38B of the phase-frequency detector 32 and the gain is controlled using an operational amplifier 44 (KM4100). The VCO 36 preferably comprises an integrated RF oscillator with buffered outputs (MAX2620EAU) and associated discrete components. A differential receiver 46 (SY100EL16VC) is used to further buffer the VCO output 34 and drive the input 42 of the phase-frequency detector 32. The frequency detect stage 14A, 14B generates the voltage reference B, D for the frequency detect logic stage 16 to compare and determine if the oscillators are operating and within tolerance.

Figure 3:
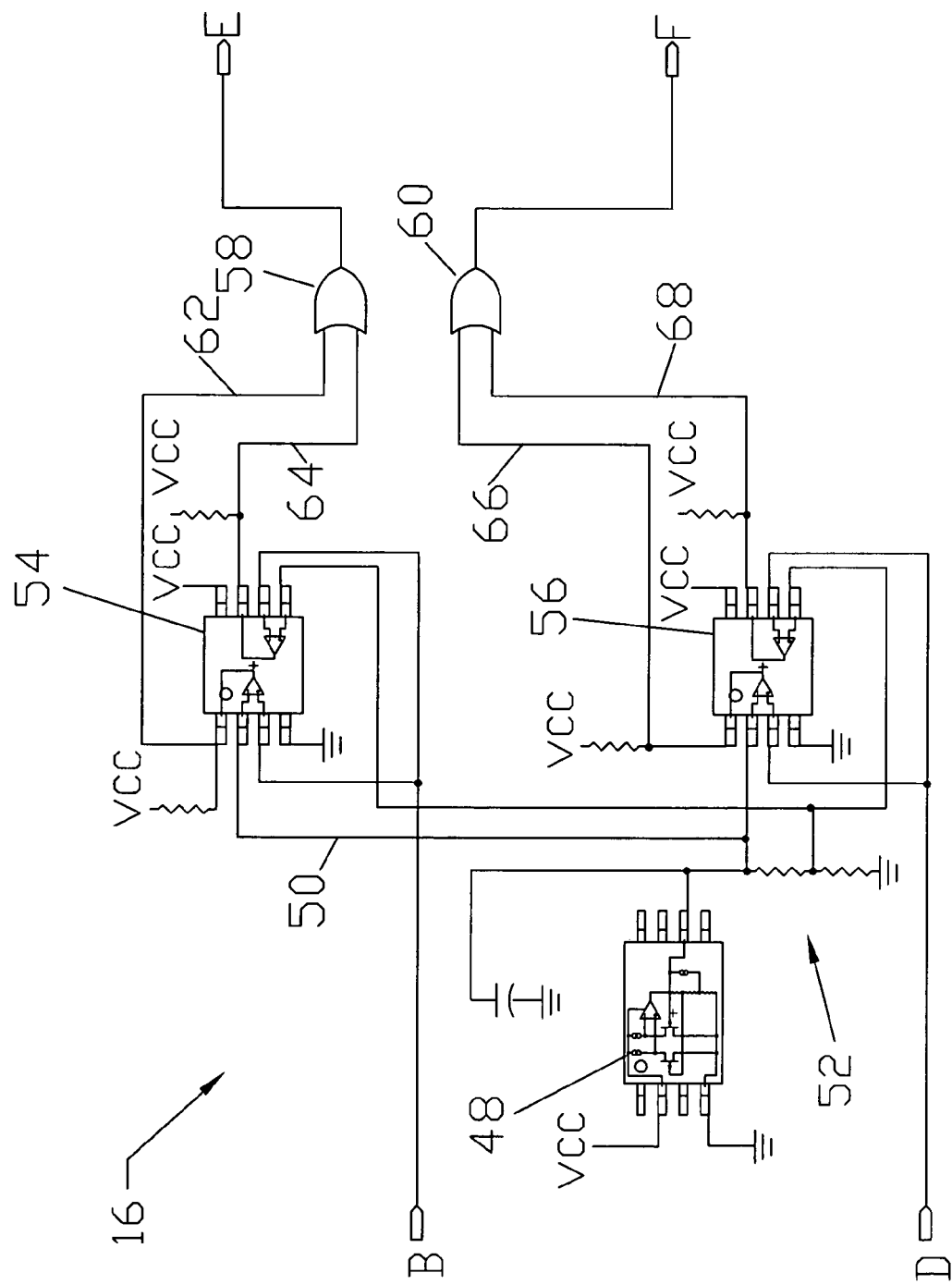
FIG. 3 is a schematic diagram of the frequency detect logic stage of the redundant clock module of the present invention.

FIG. 3 is a schematic diagram of the frequency detect logic stage 16 of the redundant clock module of the present invention. A precision voltage reference IC 48 (ADR291RU) supplies the precision voltage reference signal 50 used to create the voltage used to determine the frequency limits for a valid oscillator output frequency. A resistor voltage divider 52 is used to make the final adjustment to these limits based on the VCO voltage verses frequency characteristic. A pair of dual voltage comparators 54, 56 are used to detect the high and low levels for each oscillator based on the reference voltage already established compared to the loop filter voltage B, D. The frequency detect logic stage 16 uses analog voltage monitoring of the VCO voltage to determine if the oscillators are operating. A pair of OR gates 58, 60 are used to combine the outputs 62, 64 and 66, 68 of the dual voltage comparators 54, 56 to give one error signal per oscillator E, F. Common high and low limits are used in this example for both the primary and secondary oscillators, but separate high and low limits may be required depending on the application.

Figure 5:
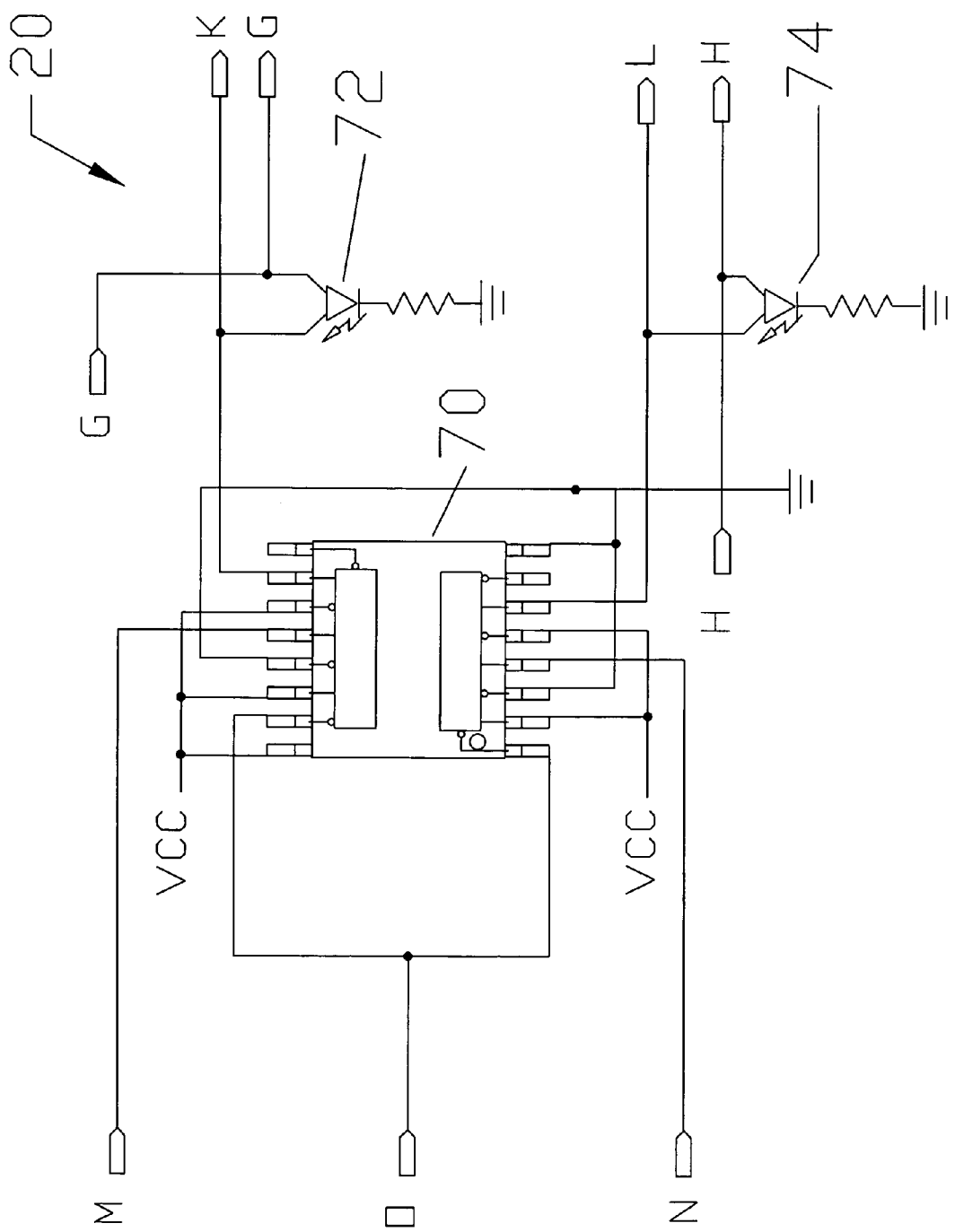
FIG. 5 is a schematic diagram of the oscillator select logic stage of the redundant clock module of the present invention.

FIG. 5 is a schematic diagram of the oscillator select logic stage 20 of the redundant clock module of the present invention. The positive edge of oscillator error signals M, N from the power, startup, reset stage 18 are used to toggle a dual flip flop 70 (74AC109). The latched signals K, L are provided to the reference oscillator input stage 12. A reset pulse O is supplied by the power, startup, reset stage 18 to reset the latch once a repair has been made or failed condition has been corrected. Optional LED indicators 72, 74 are used as a visual means for a repair technician to determine which reference oscillator has failed, using the error signals K, G, L, and H to indicate green for working oscillators and red for failed or out of tolerance oscillators.

Figure 6:
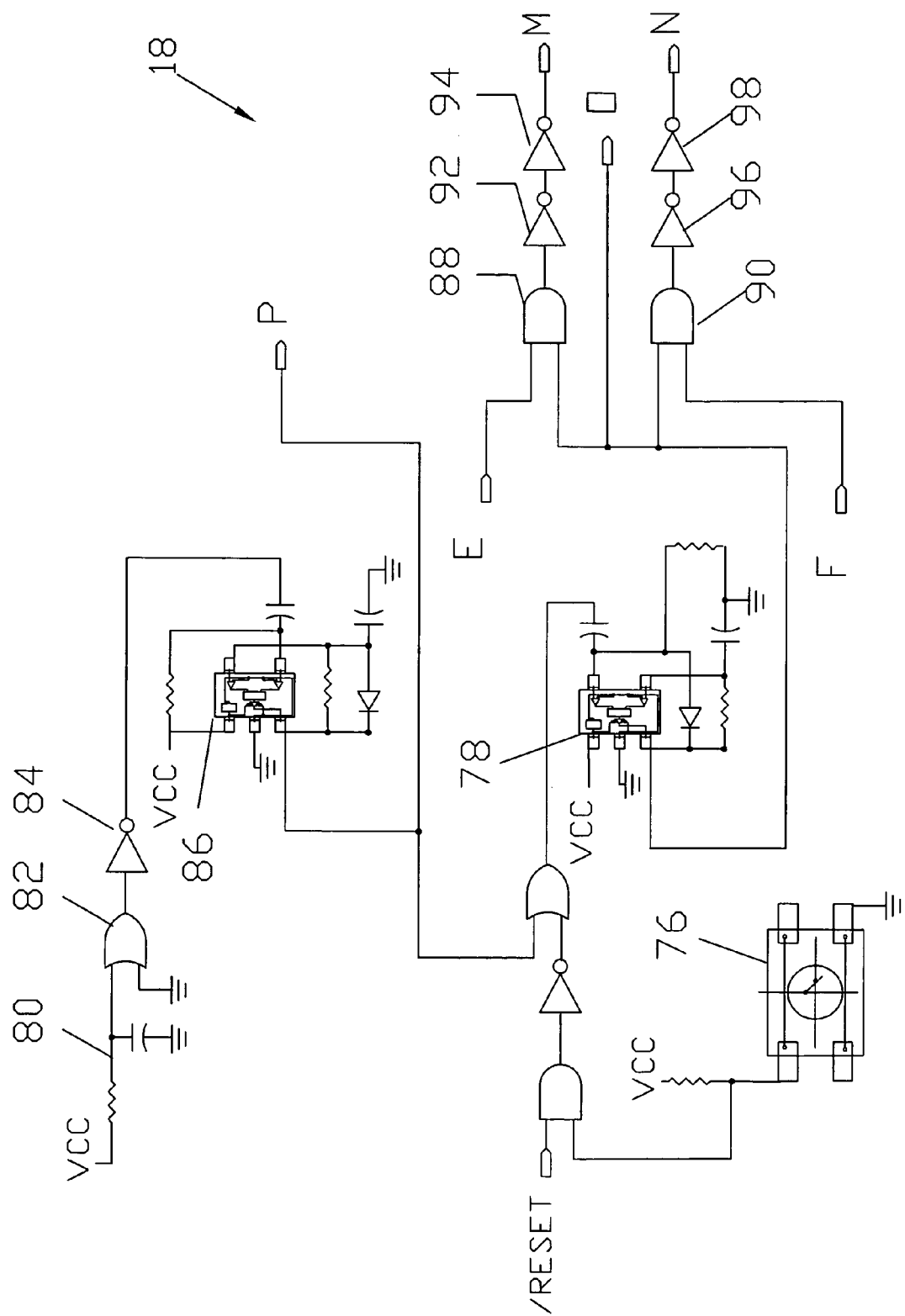
FIG. 6 is a schematic diagram of the power, startup, reset stage of the redundant clock module of the present invention.

FIG. 6 is a schematic diagram of the power, startup, reset stage 18 of the redundant clock module of the present invention. A reset pulse O initiated by an external signal /RESET, by initial power up, or by pressing an optional reset switch 76 (EVQ-P2K02Q) is generated by a timer 78 (MIC1555BM5). The initial power up initiates the reset by the resistor capacitor time constant 80 through an OR gate 82 and an inverter 84 used to trigger a timer 86 (MIC1555BM5) and the associated discrete components. Oscillator error signals E, F are combined with the reset signal O with AND gates 88, 90 and are delayed from the reset signal O using two inverters 92, 94 and 96, 98 before each error signal M, N is sent to the oscillator select logic stage 20.

Figure 7:
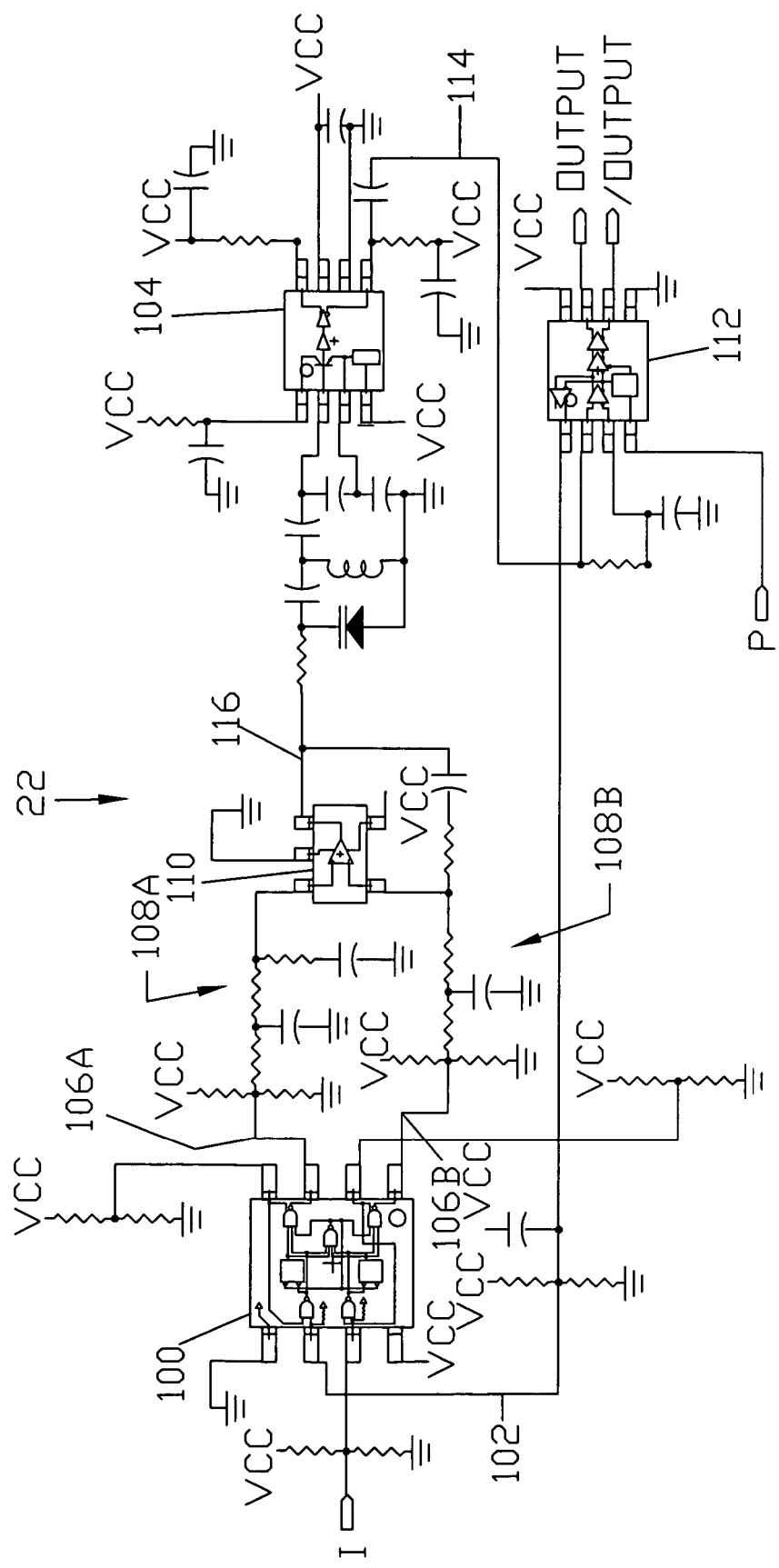
FIG. 7 is a schematic diagram of the output control loop path stage of the redundant clock module of the present invention.

FIG. 7 is a schematic diagram of the output control loop path stage 22 of the redundant clock module of the present invention. The output control loop path stage 22 is nearly identical to the frequency detect stage 14, FIG. 2, except the output control loop response is selected to be slower so that it does not change frequency quickly during switching from one oscillator to the other, and the voltage that controls the VCO is not supplied to other stages. The output control loop path stage 22 includes a phase-frequency detector 100 (MC100EP140) to compare the phase between the reference oscillator output I driving this stage and the output 102 of the VCO 104 for this stage. The output 106A, 106B of the phase-frequency detector 100 is filtered by a low pass filter 108A, 108B via the discrete components at the output 106A, 106B of the phase-frequency detector 100 and the gain is controlled using an operational amplifier 110 (KM4100). The VCO 104 preferably comprises an integrated RF oscillator with buffered outputs (MAX2620EAU) and associated discrete components. A differential receiver 112 (SY100EL16VC) is used to further buffer the VCO output 114 and drive the input 102 of the phase-frequency detector 100. The Output from the differential receiver 112 can be used to drive the end user's application or be used to drive other devices such as fanout buffers to drive multiple outputs.

While the invention has been described with reference to preferred embodiments, it is to be understood that the invention is not intended to be limited to the specific embodiments set forth above. Thus, it is recognized that those skilled in the art will appreciate that certain substitutions, alterations, modifications, and omissions may be made without departing from the spirit or intent of the invention. Accordingly, the foregoing description is meant to be exemplary only, the invention is to be taken as including all reasonable equivalents to the subject matter of the invention, and should not limit the scope of the invention set forth in the following claims.

What is claimed is:

1. A redundant clock module comprising:
   at least two oscillators, a primary oscillator providing an output to the module and at least one secondary redundant oscillator to take over for the primary oscillator in case of a failure or out of tolerance condition;
   monitoring circuitry for monitoring the outputs of the at least two oscillators, wherein the monitoring circuitry includes a control loop with a VCO and means for analog voltage monitoring of the VCO voltage to determine if the oscillators are operating;
   detection circuitry for detecting a failure or an out of tolerance condition of the oscillators; and
   switching circuitry for seamlessly switching from a failed or out of tolerance oscillator to an operating and in tolerance oscillator.

2. The redundant clock module of claim 1 wherein monitoring and detection circuitry is provided for each oscillator.

3. The redundant clock module of claim 1 wherein the oscillators are monitored by comparing the oscillator output frequency to the VCO frequency.

4. A redundant clock module comprising:
   at least two oscillators, a primary oscillator providing an output to the module and at least one secondary redundant oscillator to take over for the primary oscillator in case of a failure or out of tolerance condition;
   monitoring circuitry for monitoring the outputs of the at least two oscillators, wherein the monitoring circuitry includes a control loop with a VCO and means for analog voltage monitoring of the VCO voltage to determine if the oscillators are operating;
   detection circuitry for detecting a failure or an out of tolerance condition of the oscillators; and
   switching circuitry for seamlessly switching from a failed or out of tolerance oscillator to an operating and in tolerance oscillator;
   wherein the monitoring circuitry includes analog voltage comparators to compare the control voltage of the VCO to a fixed reference voltage that is the equivalent of the frequency limit established by the tolerance desired and the VCO voltage versus frequency characteristic.

5. The redundant clock module of claim 1 wherein the detection circuitry generates an error signal that indicates that an oscillator has failed or is out of tolerance.

6. A redundant clock module comprising:
   at least two oscillators, a primary oscillator providing an output to the module and at least one secondary redundant oscillator to take over for the primary oscillator in case of a failure or out of tolerance condition;
   monitoring circuitry for monitoring the outputs of the at least two oscillators, wherein the monitoring circuitry includes a control loop with a VCO and means for analog voltage monitoring of the VCO voltage to determine if the oscillators are operating;
   detection circuitry for detecting a failure or an out of tolerance condition of the oscillators; and
   switching circuitry for seamlessly switching from a failed or out of tolerance oscillator to an operating and in tolerance oscillator;
   wherein the switching circuitry receives error signals from the detection circuitry for detecting a failed or out of tolerance oscillator.

7. A redundant clock module comprising:
   at least two oscillators, a primary oscillator providing an output to the module and at least one secondary redundant oscillator to take over for the primary oscillator in case of a failure or out of tolerance condition;

monitoring circuitry for monitoring the outputs of the at least two oscillators, wherein the monitoring circuitry includes a control loop with a VCO and means for analog voltage monitoring of the VCO voltage to determine if the oscillators are operating;

detection circuitry for detecting a failure or an out of tolerance condition of the oscillators; and switching circuitry for seamlessly switching from a failed or out of tolerance oscillator to an operating and in tolerance oscillator;

wherein the switching circuitry removes power from the failed oscillator and switches the output to a working oscillator.

8. A redundant clock module comprising:

at least two oscillators, a primary oscillator providing an output to the module and at least one secondary redundant oscillator to take over for the primary oscillator in case of a failure or out of tolerance condition;

monitoring circuitry for monitoring the outputs of the at least two oscillators, wherein the monitoring circuitry includes a control loop with a VCO and means for analog voltage monitoring of the VCO voltage to determine if the oscillators are operating;

detection circuitry for detecting a failure or an out of tolerance condition of the oscillators;

switching circuitry for seamlessly switching from a failed or out of tolerance oscillator to an operating and in tolerance oscillator; and control circuitry with a control loop and a VCO having a slower response time than the detection circuitry control loop so that it does not change frequency quickly during switching from one oscillator to another.

9. The redundant clock module of claim 1 further comprising fault indication means for visually determining which oscillators has failed and needs to be replaced.

10. A redundant clock module comprising:

at least two reference oscillators;

at least two monitoring circuits for monitoring the outputs of at least two reference oscillators;

a detection circuit for detecting a failure or out of tolerance condition of the oscillators; and wherein the monitoring and detection circuits include analog voltage comparators to compare a control voltage of a VCO to a fixed reference voltage that is the equivalent of the frequency limit established by the tolerance desired and the VCO voltage versus frequency characteristic.

11. A redundant clock module comprising:

a reference oscillator input stage;

at least two frequency detect stages for monitoring outputs of at least two reference oscillators in the reference oscillator input stage, wherein the frequency detect stages include a phase-frequency detector, a control loop with a VCO, and a VCO control voltage for monitoring the outputs of the oscillators;

a frequency detect logic stage, wherein the frequency detect logic stage includes at least two analog voltage comparators to compare the control voltage of the VCO to a fixed reference voltage that is the equivalent of the frequency limit established by the tolerance desired and the VCO voltage versus frequency characteristic;

a power, startup, reset stage;

an oscillator select logic stage; and an output control loop path stage, wherein the output control loop path stage includes a phase-frequency detector, a control loop with a VCO for allowing the output frequency of the VCO to change slowly in the event that a reference oscillator fails and outputting an reference oscillator output.

* * * * *